US008509937B2

(12) United States Patent
Takuma

(10) Patent No.: US 8,509,937 B2
(45) Date of Patent: Aug. 13, 2013

(54) PROCESSING APPARATUS AND OPERATING METHOD THEREFOR

(75) Inventor: Kouji Takuma, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 827 days.

(21) Appl. No.: 12/683,112

(22) Filed: Jan. 6, 2010

(65) Prior Publication Data

US 2010/0174397 A1   Jul. 8, 2010

(30) Foreign Application Priority Data

Jan. 7, 2009   (JP) .................................. 2009-001775

(51) Int. Cl.
G06F 19/00   (2011.01)

(52) U.S. Cl.
USPC ........... 700/112; 700/100; 700/121; 700/282; 700/285; 700/99; 700/101; 700/102

(58) Field of Classification Search
USPC ................... 700/100, 112, 121, 282, 285, 99, 700/101, 102
See application file for complete search history.

(56) References Cited

U.S. PATENT DOCUMENTS

| 5,975,097 | A   | * | 11/1999 | Yonemizu et al. | ........... 134/95.2 |
| 6,309,279 | B1  | * | 10/2001 | Bowman et al.   | ................ 451/41 |
| 6,711,454 | B2  | * | 3/2004  | Joma et al.     | .................... 700/121 |
| 7,171,973 | B2  |   | 2/2007  | Orii et al.     | |
| 7,819,079 | B2  | * | 10/2010 | Englhardt et al. | ............ 118/500 |
| 2001/0017103 | A1 | * | 8/2001  | Takeshita et al. | ............... 118/50 |
| 2002/0020714 | A1 | * | 2/2002  | Pozniak et al.  | ............... 222/129 |
| 2004/0002224 | A1 | * | 1/2004  | Chono et al.    | .................. 438/714 |
| 2006/0155412 | A1 | * | 7/2006  | Ikeda           | ............................ 700/112 |
| 2006/0213542 | A1 | * | 9/2006  | Abiko et al.    | .................... 134/61 |
| 2007/0144439 | A1 | * | 6/2007  | Englhardt et al. | ............. 118/719 |

FOREIGN PATENT DOCUMENTS

| JP | 2003-100576 A | 4/2003 |
| JP | 2008-34490 A  | 2/2008 |
| JP | 2008-034490 A | 2/2008 |

* cited by examiner

Primary Examiner — Kavita Padmanabhan
Assistant Examiner — Sunray R Chang
(74) Attorney, Agent, or Firm — Abelman, Frayne & Schwab

(57) ABSTRACT

Disclosed is a processing apparatus to restrain load of a common usage system shared by a plurality of liquid processing modules. A processing module group includes k sets of share groups comprising a plurality of processing modules to perform an identical processing for each substrate (where, k≧2), each set of share groups includes n processing modules (where, n≧2), and each processing module includes the common usage system shared by n processing modules in each set and having a maximum capacity capable of processing m processing modules (where m≦n). A carrying mechanism repeatedly loads a substrate one by one to the processing module of each set in sequence. At this time, (1) after the completion of the processing in one processing module that uses the common usage system, the substrate is loaded into another processing module in the same set, or (2) without waiting for the completion of the processing in one processing module, the substrate is loaded into another processing module and then the processing is started in another processing module after the completion of the processing in one processing module.

14 Claims, 14 Drawing Sheets

■ WAFER LOADING/UNLOADING ACTION
▨ ENTIRE LIQUID PROCESSING

FIG.3

| MODULE NUMBER | SHARE GROUP NUMBER |
|---|---|
| MODULE 1 | GROUP 1 |
| MODULE 2 | |
| MODULE 3 | GROUP 2 |
| MODULE 4 | |
| MODULE 5 | GROUP 3 |
| MODULE 6 | |
| MODULE 7 | GROUP 4 |
| MODULE 8 | |
| MODULE 9 | GROUP 5 |
| MODULE 10 | |
| MODULE 11 | GROUP 6 |
| MODULE 12 | |

FIG.12

| | | | | | | | | | | |
|---|---|---|---|---|---|---|---|---|---|---|
| | MODULE 1 | ■ | 1 | 2 | 3 | ■ 1 | 2 | 3 | ■ 1 | 2 |
| GROUP 1 | MODULE 2 | | ■ 1 | 2 | 3 | ■ 1 | 2 | 3 | ■ | ... |
| | MODULE 3 | | | ■ 1 | 2 | 3 | ■ 1 | 2 | 3 | ... |
| | MODULE 4 | ■ | 1 | 2 | 3 | ■ 1 | 2 | 3 | ■ 1 | ... |
| GROUP 2 | MODULE 5 | | ■ 1 | 2 | 3 | ■ 1 | 2 | 3 | ■ | ... |
| | MODULE 6 | | | ■ 1 | 2 | 3 | ■ 1 | 2 | ... | |

■ WAFER LOADING/UNLOADING ACTION
1 FIRST PROCESSING
2 SECOND PROCESSING
3 THIRD PROCESSING

FIG.13

| | | | | | | | | | | | |
|---|---|---|---|---|---|---|---|---|---|---|---|
| | MODULE 1 | | 1 | 2 | 3 | | 1 | 2 | 3 | | 1 | 2 |
| GROUP 1 | MODULE 2 | | | 1 | 2 | 3 | | 1 | 2 | 3 | | 1 | ... |
| | MODULE 3 | | | | 1 | 2 | 3 | | 1 | 2 | 3 | | 1 |
| | MODULE 4 | | 1 | 2 | 3 | | 1 | 2 | 3 | | 1 | 2 |
| GROUP 2 | MODULE 5 | | | 1 | 2 | 3 | | 1 | 2 | 3 | | 1 | ... |
| | MODULE 6 | | | | 1 | 2 | 3 | | 1 | 2 | 3 | | 1 |

■ WAFER LOADING/UNLOADING ACTION
1 FIRST PROCESSING
2 SECOND PROCESSING
3 THIRD PROCESSING

FIG. 14

| | | | | | | | |
|---|---|---|---|---|---|---|---|
| MODULE 1 | ■ | Al | R* | Ac | R | IPA | |
| MODULE 2 | | ■ | Al | R* | Ac | R | IPA |
| MODULE 3 | | | ■ | Al | R* | Ac | R | IPA |
| MODULE 4 | | | | ■ | Al | R* | Ac | R | IPA |
| MODULE 5 | | | | | ■ | Al | R* | Ac | R | IPA |
| MODULE 6 | | | | | | ■ | Al | R* | Ac | R | IPA |
| MODULE 7 | | | | | | | ■ | Al | R* | Ac | R | IPA |
| MODULE 8 | | | | | | | | ■ | Al | R* | Ac | R | IPA |
| MODULE 9 | | | | | | | | | ■ | Al | R* | Ac | R | IPA |
| MODULE 10 | | | | | | | | | | ■ | Al | R* | Ac | R | IPA |
| MODULE 11 | | | | | | | | | | | ■ | Al | R* | Ac | R | IPA |
| MODULE 12 | | | | | | | | | | | | ■ | Al | R* | Ac | R | IPA |

■ WAFER LOADING/UNLOADING ACTION
Al ALKALINE CHEMICAL LIQUID PROCESSING
R RINSE CLEANING
R* RINSE CLEANING WITH SPIN-DRYING
Ac ACID LIQUID PROCESSING
IPA IPA DRYING

PROCESSING APPARATUS AND OPERATING METHOD THEREFOR

This application is based on and claims priority from Japanese Patent Application No. 2009-001775, filed on Jan. 7, 2009, with the Japanese Patent Office, the disclosure of which is incorporated herein in its entirety by reference.

TECHNICAL FIELD

The present disclosure relates to a processing apparatus which performs a processing, such as a liquid processing, cleaning processing, or a vacuum drying for a substrate such as a semiconductor wafer, and a method for operating the processing apparatus, and more particularly to technology for processing a substrate using a plurality of processing modules.

BACKGROUND

A process for manufacturing a semiconductor device or a Flat Panel Display (FPD) such as a liquid crystal display device, includes a liquid processing of supplying a processing liquid, such as a chemical liquid or deionized water, to a surface of a semiconductor wafer (hereinafter, referred to as "wafer") or a glass substrate, to remove particles or contaminants attached to the substrate.

According to one example of the liquid processing apparatuses to perform the liquid processing, a liquid processing apparatus is provided in which substrates are laid on a spin chuck one after another and the processing liquid is supplied to the surface of the substrate while rotating the substrate. In such a type of the liquid processing apparatus, a plurality of liquid processing modules that perform the liquid processing are connected to a common substrate carrying unit so that the substrate is continuously replaced while performing the liquid processing in the plurality of liquid processing modules (see Japanese Laid-Open Patent Publication No. 2008-34490, paragraph 0020, FIG. 1).

FIG. 14 illustrates an example of a liquid processing schedule of the liquid processing apparatus including twelve (12) liquid processing modules. In the liquid processing apparatus shown in FIG. 14, each liquid processing module is configured to perform a series of processes of loading a wafer→removing particles or organic contaminants with an alkaline chemical liquid (an alkaline chemical liquid processing)→removing the remaining alkaline chemical liquid with deionized water and spin-drying (a rinse cleaning)→removing a natural oxide film on the surface of the wafer with an acid chemical liquid (an acid chemical liquid processing)→removing the remaining acid chemical liquid with deionized water (a rinse cleaning)→supplying Isopropyl Alcohol (IPA) and spin-drying (an IPA drying)→unloading the wafer. In the meantime, for the simple description, FIG. 14 illustrates only one cycle of a series of the liquid processing.

In such a liquid processing apparatus, a module number (from module 1 to module 12) is assigned based on an arrangement order of the liquid processing modules and the wafer is loaded in the order of a smaller module number to perform the aforementioned processing in sequence. In this case, as shown in FIG. 14, with respect to the adjacently arranged module 1 and module 2, when the alkaline chemical liquid processing is performed in module 1, timing for concurrently performing the identical processing in module 2 is regularly generated.

Because of this, if various equipments related to the chemical liquid supply, drainage, exhaustion, or the like, are commonly provided for the plurality of modules of the liquid processing apparatus (hereinafter, such equipments are referred to as "a common usage system"), the common usage system is required to have a capacity for satisfying the maximum amount of consumption of the chemical liquid, the maximum drainage volume, or the maximum exhaustion volume for the plurality of modules. Such requirement causes the size of the common usage system to become large and to increase the expense of equipment. Further, the drained liquid and exhausted gas of the liquid processing apparatus are generally transferred to drainage processing equipment and exhaustion processing equipment of a whole factory. However, if the liquid processing apparatus is connected to the factory through the aforementioned common usage system, it is necessary to request the factory to design the maximum drainage volume and exhaustion volume in each common usage system as the maximum load and the decrease of such load requested on the factory has been a high-priority subject.

SUMMARY

According to one embodiment, a processing apparatus includes a processing module group including k sets of share groups comprising a plurality of processing modules to perform an identical processing for a substrate respectively (where k is a natural number equal to or greater than 2), each set of the share groups including n processing modules (where n is a natural number equal to or greater than 2), a common usage system shared by n processing modules in each set, a carrying device to transfer a substrate to the processing module, and a controlling unit to control the carrying device to repeatedly perform a loading action that sequentially loads the substrate from a first set to a $k^{th}$ set of the share groups. The common usage system is independently provided for each set, and has a capacity capable of processing m processing modules (where m is a natural number less than n), the capacity being identical for each set. when the common usage system is used for m processing modules of each set, the controlling unit further (1) controls the carrying device, after completing the processing in one processing module that uses the common usage system, to load the substrate to another processing module in the set in which the processing module is included or (2) controls the processing module, without waiting for the completion of the processing in one processing module, to load the substrate to another processing module and to start the processing in another processing module after the completion of the processing in one processing module. Herein, the phrase, "processing of m processing modules (where m is a natural number less than n)" refers to a processing performed in one processing module where m=1, and refers to a processing concurrently performed in m processing modules where m≧2.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a diagram illustrating the state in which the liquid processing modules are divided into groups for each of common usage systems.

FIG. 12 is a diagram illustrating an example of a processing schedule of a liquid processing executed in each liquid processing module of the liquid processing unit according to another embodiment.

FIG. 13 is a diagram illustrating another example of a processing schedule of a liquid processing executed in each liquid processing module of the liquid processing unit according to another embodiment.

FIG. 14 is a diagram illustrating a processing schedule of a liquid processing executed in the conventional liquid processing apparatus.

DETAILED DESCRIPTION

Figure 1:
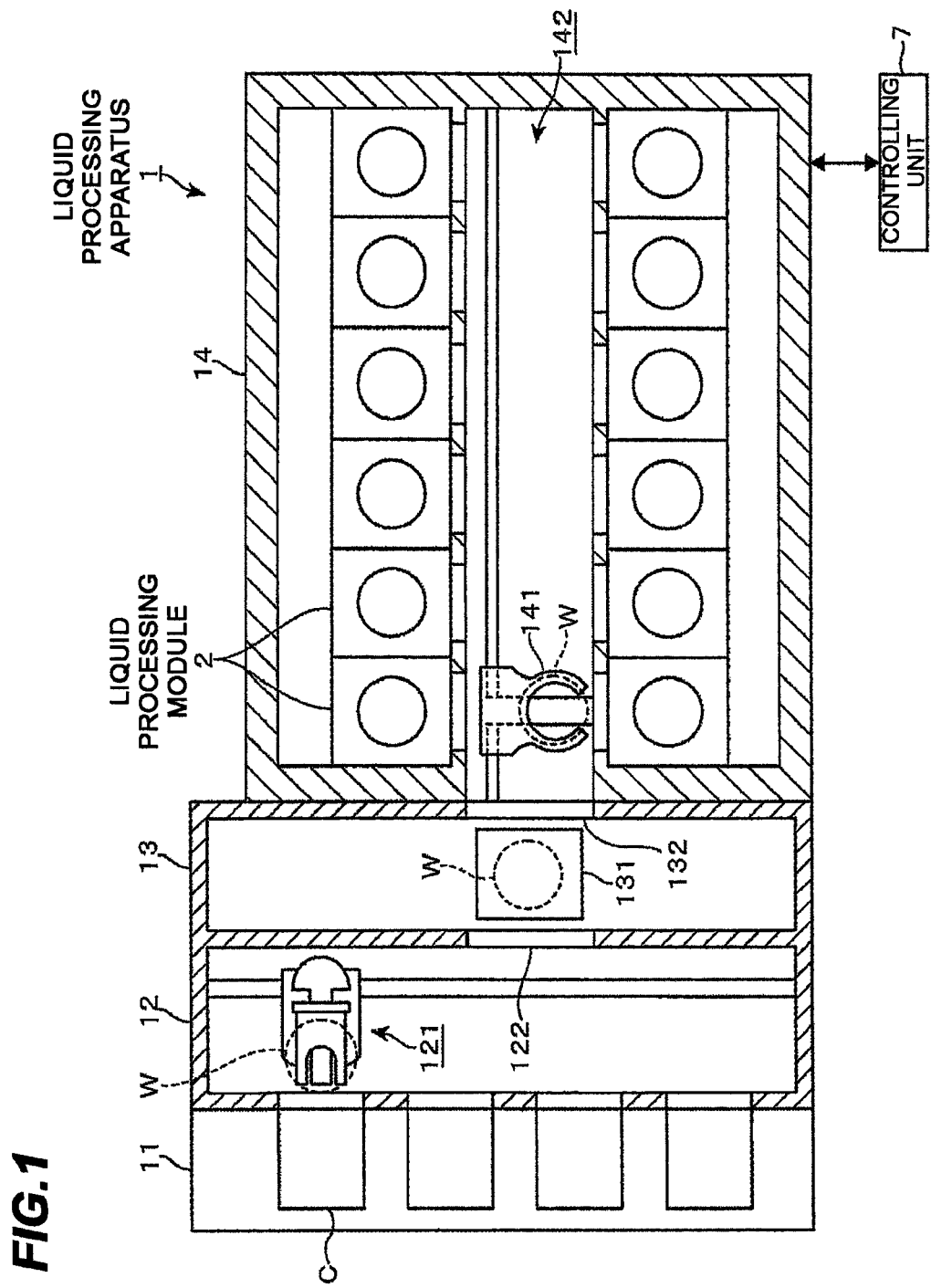
FIG. 1 is a cross-sectional plan diagram illustrating the entire configuration of a liquid processing apparatus according to one embodiment.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure is to provide a processing apparatus and a method for operating the processing apparatus in which a usage system for a plurality of processing modules is shared and the use of maximum capacity required to the usage system is refrained so that the low capacity of the usage system can be used.

According to one embodiment, the common usage system includes a shifting unit to shift a usage of the common usage system from one processing module to another processing module at the time of loading the substrate in a case where the carrying device, after completing the processing in one processing module that uses the common usage system, loads the substrate to another processing module in the set in which the processing module is included, or at the time of starting the processing in a case where without waiting for the completion of the processing in one processing module, the processing module loads the substrate to another processing module, and after the completion of the processing in one processing module, the processing module starts the processing in another processing module.

According to one embodiment, the processing performed in the processing module includes a process to supply a processing liquid to the substrate and the common usage system is an exhaust system to exhaust an atmosphere of the processing liquid in the processing module.

According to one embodiment, the processing performed in the processing module is a chemical liquid processing continuously performed several times with changing a type of a chemical liquid supplied to the substrate, and the common usage system is an exhaust system provided for each type of chemical liquid and configured to exhaust an atmosphere of the chemical liquid during the chemical liquid processing.

According to one embodiment, the processing performed in the processing module is a chemical liquid processing and the chemical liquid processing is a process to clean the substrate.

According to one embodiment, the processing performed in the processing module includes a process to supply the processing liquid to the substrate, and the common usage system is a processing liquid supply system to supply the processing liquid.

According to one embodiment, the processing performed in the processing module includes a process to supply the processing liquid to the substrate, and the common usage system is a drainage system to discharge a liquid scattered or overflowed from the substrate.

According to another embodiment, there is provided a method for operating a processing apparatus. The processing apparatus includes a processing module group including k sets of share groups comprising a plurality of processing modules to perform an identical processing for each substrate (where k is a natural number equal to or greater than 2). Each set of the share groups includes n processing modules (where n is a natural number equal to or greater than 2). The processing apparatus further includes a common usage system shared by n processing modules in each set, independently provided for each set, and having a capacity capable of processing m processing modules (where m is a natural number less than n). The capacity is identical in each set. The method includes repeatedly loading a substrate to a first set to a $k^{th}$ set of the share groups in sequence by a carrying device, and when the common usage system is used for m processing modules of each set, (1) after completing the processing in one processing module that uses the common usage system, loading the substrate to another processing module in the set, or (2) without waiting for the completion of the processing in one processing module, loading the substrate to another processing module, and after the completion of the processing in one processing module, starting the processing in another processing module. Herein, the "processing of m processing modules (where m is a natural number less than n)" refers to a processing performed in one processing module where m=1, and refers to a processing concurrently performed in m processing modules where m≧2.

According to one embodiment, the processing apparatus in which the usage system used for the chemical liquid supply, drainage, and exhaustion of the inside of the processing module is shared by the plurality of processing modules controls the timing for performing the processing in each module in order not to concurrently perform the identical processing by all of the processing modules sharing the common usage system so that the use of the maximum capacity required in the common usage system can be restrained. As a result, the processing apparatus can attribute to reducing the expense of equipment and saving energy, and reduce the load in designing required from the processing apparatus to the factory.

As one example of the processing apparatus according to the present disclosure, an embodiment of a liquid processing apparatus 1 that supplies a chemical liquid to a wafer W serving as a substrate to perform a liquid processing will be described. FIG. 1 is a cross-sectional plan diagram illustrating the entire configuration of liquid processing apparatus 1, a left side of which is assumed as a front side. Liquid processing apparatus 1 includes a carrier arrangement unit 11 on which a carrier C receiving a plurality of wafers W is laid, a carrying unit 12 to take out wafer W from carrier C and load it into liquid processing apparatus 1, a transferring unit 13 to transfer wafer W taken out from carrying unit 12 to a liquid processing unit 14 located at a rear end, and liquid processing unit 14 to load wafer W transferred from transferring unit 13 into each liquid processing module 2 to perform the liquid processing, and these constitutional elements are sequentially connected from the front side.

A carrier arrangement unit 11 includes an arrangement plate on which four (4) carriers C can be laid and fixes each carrier C laid on the arrangement plate to make each carrier C be connected to carrying unit 12. Carrying unit 12 includes an opening/closing device (not shown) to open and close an opening/closing door provided on a surface connected with each carrier C and a first carrying mechanism 121 to take out wafer W from carrier C and to carry wafer W to transferring unit 13 within a common case. First carrying mechanism 121 can move in forward and backward directions and in left and right directions, and include a carrying arm capable of rotating and moving up and down and a driving unit thereof. Further, first carrying mechanism 121 loads and unloads wafer W to and from transferring unit 13 through a first opening 122 formed on a partitioning wall that partitions carrying unit 12 and transferring unit 13.

Transferring unit 13 is a space provided within a case interposed between carrying unit 12 and liquid processing unit 14. For example, a transferring shelf 131 to lay wafer W before and after the liquid processing is provided between first opening 122 of carrying unit 12 and a second opening 132 formed on a partitioning wall of liquid processing unit 14. For example, eight (8) wafers W can be laid on transferring shelf 131 and transferring shelf 131 functions as a buffer on which wafer W loaded in or unloaded from carrying unit 12 and wafer W loaded in or unloaded from liquid processing unit 14 are temporarily laid.

Liquid processing unit 14 includes a processing module group including, for example, twelve (12) liquid processing modules 2 performing the liquid processing for wafer W within the case connected to a rear end of transferring unit 13. Liquid processing unit 14 includes a carrying path 142 for wafer W extending in a forward and backward direction from said second opening 132 that is arranged on the partitioning wall that partitions liquid processing unit 14 and transferring unit 13 therein. Twelve (12) liquid processing modules 2 are installed in line by six (6) liquid processing modules in a left side and six (6) liquid processing modules in a right side, respectively, with respect to second opening 132, along with carrying path 142. A second carrying mechanism 141 is installed within carrying path 142. Second carrying mechanism 141 can move along with carrying path 142 and include a carrying arm capable of moving toward or from each liquid processing module 2 installed in a left and right side of carrying path 142, rotating and moving up and down, and its driving unit so that second carrying mechanism 141 can carry wafer W between transferring shelf 131 and each liquid processing module 2. Though FIG. 1 illustrates an example of installing one set of second carrying mechanism 141, liquid processing unit 14 may include two sets or more of second carrying mechanisms depending on the number of to-be-installed liquid processing modules 2.

Figure 2:
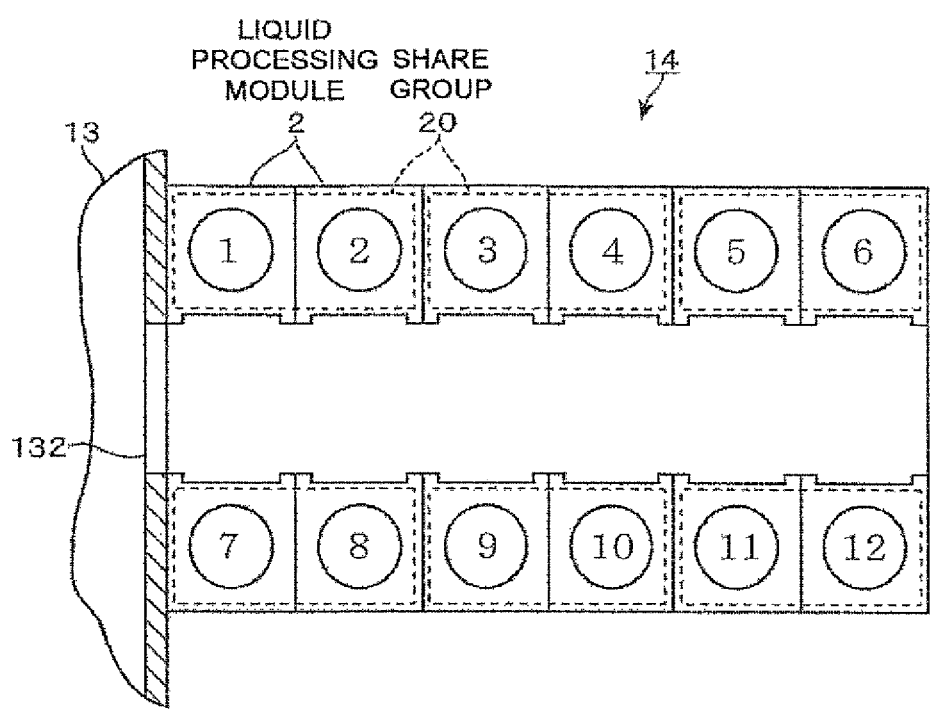
FIG. 2 is a schematic diagram illustrating an arrangement of the liquid processing modules installed in a liquid processing unit of the liquid processing apparatus.

For example, as shown in FIG. 2, liquid processing modules 2 installed in line in a left side from the front side view (a side of second opening 132) are denoted with module numbers from 1 to 6 from a front to an inside, respectively, and liquid processing modules 2 installed in line in a right side are denoted with module numbers from 7 to 12 as well. Further, adjacent two (2) liquid processing modules 2 represented in an enclosed dashed-line in FIG. 2 consist one set and each set shares a common usage system relating to a supply system of the chemical liquid, drainage system, or exhaust system. From the description below, the set of the liquid processing modules 2 is referred to as a share group 20 and the group numbers (set numbers) of 1 to 6 are denoted to share groups 20. The relation between the module number and the group number is shown in FIG. 3.

Figure 4:
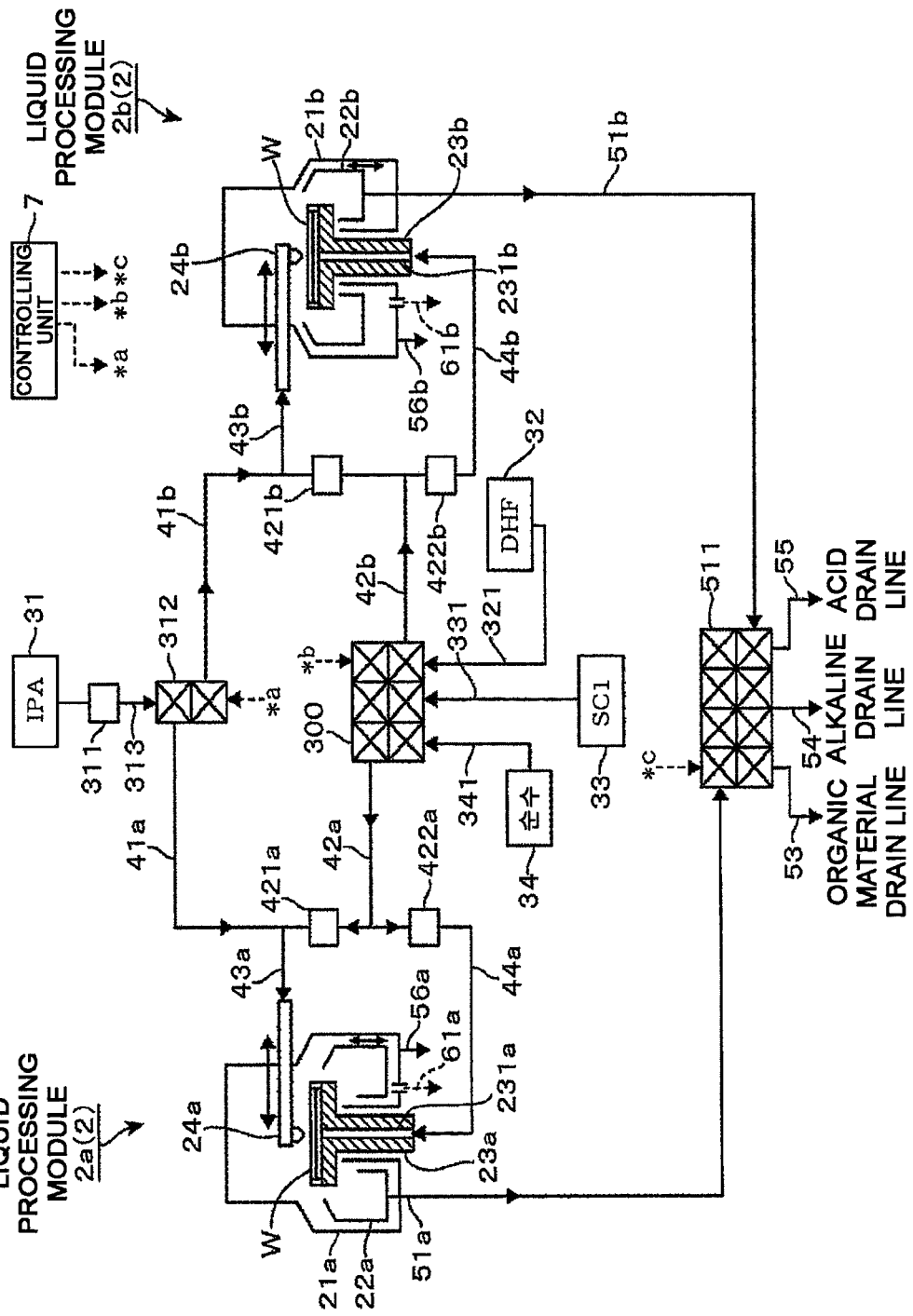
FIG. 4 is a diagram illustrating the configuration of the liquid processing modules for each of common usage systems and a chemical liquid supply system and drainage system installed in the liquid processing modules.
Figure 5:
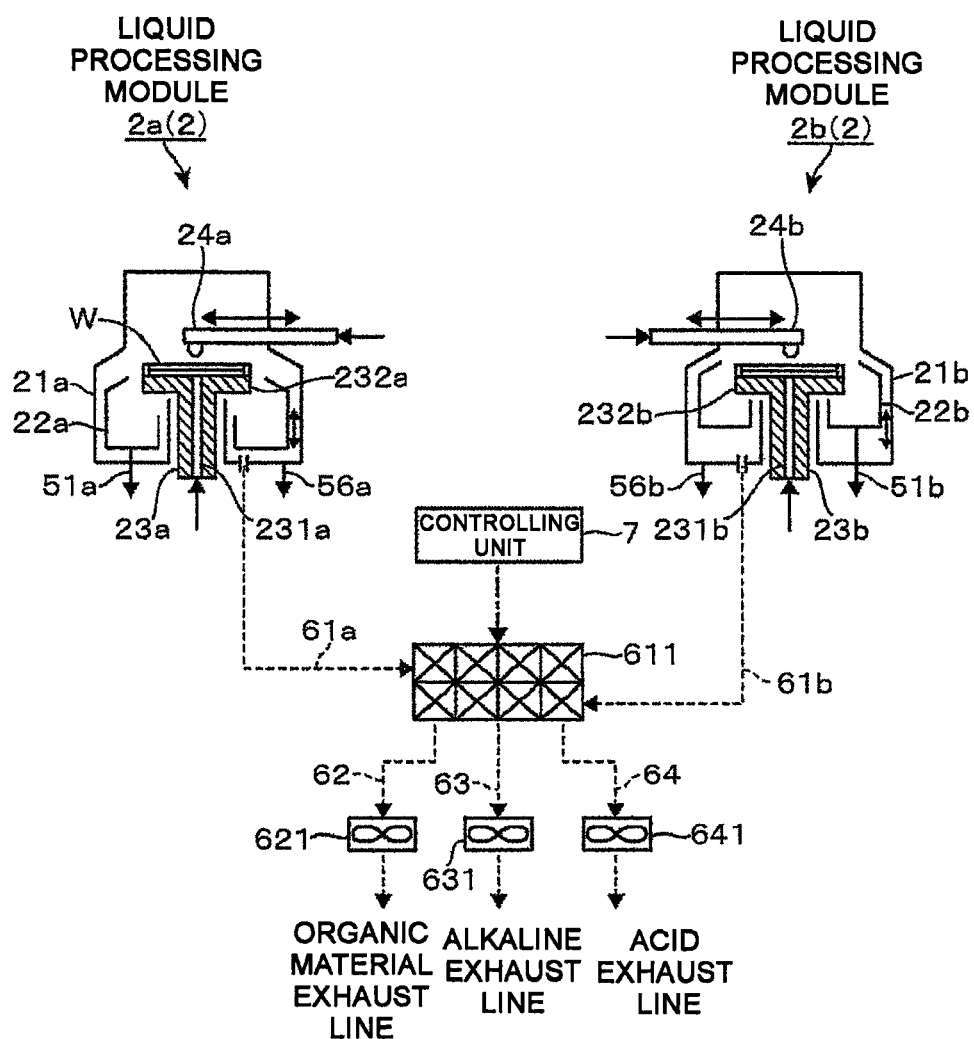
FIG. 5 is a diagram illustrating an exhaust system provided in each of common usage systems.

FIG. 4 illustrates a schematic configuration of liquid processing module 2 consisting of each share group 20, a supply system, and a drainage system of various chemical liquids, and FIG. 5 illustrates an exhaust system of liquid processing module 2. In FIGS. 4 and 5, one liquid processing module within share group 20 is denoted with a reference number "2a" and the other liquid processing module within share group 20 is denoted with a reference number "2b."

Since liquid processing modules 2a and 2b consisting each share group 20 have almost the same configuration, the configuration of liquid processing module 2 will be described with reference to liquid processing module 2a shown in a left side of FIG. 4. Liquid processing module 2a includes an external chamber 21a forming a sealed processing space in which each process of a liquid processing, rinse cleaning, and spin-drying for wafer W is performed, a wafer holding mechanism 23a installed within external chamber 21a to rotate wafer W while maintaining wafer W in an almost horizontal state, a nozzle arm 24a to supply a chemical liquid to an upper surface of wafer W held on wafer holding mechanism 23a, and an internal cup 22a installed within external chamber 21 to enclose wafer holding mechanism 23a to receive the chemical liquid scattered from rotating wafer W to a periphery.

External chamber 21a is installed within the case partitioned with another adjacent liquid processing module 2 as shown in FIGS. 1 and 2, and wafer W is loaded and unloaded by second carrying mechanism 141 through a wafer loading port (not shown). Further, a chemical liquid supply path 231a is arranged within wafer holding mechanism 23a to supply the chemical liquid to a lower surface of rotating wafer W through chemical liquid supply path 231a.

Nozzle arm 24a includes a nozzle to supply the chemical liquid in its front part and the nozzle moves between an upper position of a center of wafer W held by wafer holding mechanism 23a and a standby position provided in an exterior part of external chamber 21a by a driving mechanism (not shown). Internal cup 22a is adapted to move up and down between a processing position that surrounds wafer W held by wafer holding mechanism 23a and a recession position receded in a lower direction from the processing position. FIG. 4 illustrates a state where internal cup 22b of liquid processing module 2b in the right side is ascended up to the processing position and internal cup 22a of liquid processing module 2a in the left side is descended down to the recession position.

Next, the supply mechanism of the chemical liquid of liquid processing module 2a will be described. The nozzle installed in nozzle arm 24a is connected to an upper side supply line 43a which is branched into an IPA supply interim line 41a and a chemical liquid supply interim line 42a. IPA supply interim line 41a is connected to an IPA supply unit 31 through a shift valve 312 serving as a shifting unit and an IPA supply line 313. IPA supply unit 31 supplies the IPA to the upper surface of wafer W to dry the surface of wafer W using the high volatility. IPA supply unit 31, for example, includes a chemical liquid tank (not shown) to store the IPA and a chemical liquid pump (not shown) and supplies a predetermined amount of the IPA to nozzle arm 24a by a mass flow controller 311 installed in IPA supply line 313.

Also, chemical liquid supply interim line 42a branched from upper side supply line 43a is connected to three systems of chemical liquid supply lines 321, 331 and 341 through shift valve 300 which is the shifting unit. A DHF supply unit 32 is provided in an upstream of a DHF supply line 321 to supply a Diluted HydroFluoric acid (DHF) solution (hereinafter, referred to as "the DHF solution") which is an acid chemical liquid to remove a natural oxide film of the surface of wafer W. Further, an SC1 supply unit 33 is provided in an upstream of an SC1 supply line 331 to supply an SC1 solution (an ammonia-hydrogen peroxide solution) that is a chemical liquid to remove particles or organic contaminants of the surface of wafer W. Further, a deionized water supply unit 34 is provided in an upstream of a deionized water supply line 341 to supply deionized water that is a rinsing liquid to remove the DHF solution or SC1 solution remaining on wafer W after the chemical liquid processing. Each of DHF supply unit 32, SCI supply unit 33, and deionized water supply unit 34 includes a chemical liquid tank (not shown) and a chemical liquid pump (not shown), as in the case of IPA supply unit 31.

Further, chemical liquid supply interim line 42a to which DHF supply unit 32, SC1 supply unit 33, and deionized water supply unit 34 are connected is connected to a chemical liquid supply path 231a to supply the chemical liquid to the lower surface of wafer W through a lower side supply line 44a. In FIG. 4, reference numbers 421a and 422a denote the mass flow controllers to control the chemical liquid amount supplied to nozzle arm 24a and wafer holding mechanism 23a, respectively.

Through the above configuration, liquid processing module 2a can supply the chemical liquid of the IPA, DHF solution, and SC1 solution, and the deionized water to the upper surface of wafer W held by wafer holding mechanism 23a through nozzle arm 24a and supply the chemical liquid of the DHF solution, SC1 solution, and the deionized water to the lower surface of wafer W through chemical liquid supply path 231a arranged within wafer holding mechanism 23a.

Next, the configuration of the drainage system will be described. For example, a drain line 51a is connected to a lower surface of internal cup 22a to discharge the IPA, DHF solution, and SC1 solution. Further, an organic material drain line 53 serving as a discharge destination of the IPA, an alkaline drain line 54 serving as a discharge destination of the SC1 solution, and an acid drain line 55 serving as a discharge destination of the DHF solution are connected to a downstream of drain line 51a through shift valve 511 serving as the shifting unit.

Further, a water drainage line 56a is installed in a lower surface of external chamber 21a so that the rinsing liquid (water including the DHF solution or SC1 solution of low concentration) collected in a bottom part of external chamber 21a can be discharged when wafer W is rotated in a state of internal cup 22a being descended during the rinse cleaning.

The configuration of aforementioned liquid processing module 2a, the supply system of the chemical liquid, and the drainage system is identically employed to the other liquid processing module 2b installed in same share group 20, and each constitutional element of the reference number including added alphabet, $\lceil b_{\rfloor}$, has the identical structure and function to the constitutional element having the corresponding reference number of liquid processing module 2a. Further, the supply system of the chemical liquid of IPA supply unit 31, DHF supply unit 32, SC1 supply unit 33, deionized water supply unit 34 or each shift valve 312 and 300, and the drainage system of organic drain line 53, alkaline drain line 54, acid drain line 55 or shift valve 511 having no added alphabets of $\lceil$a or b$_{\rfloor}$ in the reference numbers correspond to the common usage system of liquid processing modules 2a and 2b in the present embodiment. Such a common usage system is shifted between liquid processing module 2a and liquid processing module 2b for use as described later and is not used at the same time so that the capacity of the chemical liquid pump installed in IPA supply unit 31, or the like, or a diameter of the tube of shift valve 312, or the like, is designed to satisfy the maximum load for one of liquid processing modules 2a and 2b.

Next, the configuration of the exhaust system shown in FIG. 5 will be described. Since liquid processing modules 2a and 2b for exhaustion have almost identical constructions for exhaustion, a liquid processing module will be described with reference to liquid processing module 2a shown in a left side of FIG. 5. A common exhaust line 61a is connected to a lower surface of external chamber 21a and a front end of common exhaust line 61a, for example, upwardly protrudes from a lower surface of external chamber 21a so that the liquid discharged from the lower surface of external chamber 21a to water drainage line 56a is prevented from flowing into common exhaust line 61a. A downstream side of common exhaust line 61a is connected with an organic exhaust line 62 serving as an exhaust destination of an air stream including mist of the IPA, an alkaline exhaust line 63 serving as an exhaust destination of an air stream including mist of the SC1 solution, and an acid exhaust line 64 serving as an exhaust destination of an air stream including mist of the DHF solution. These exhaust lines 62, 63, and 64 are shifted to be connected to common exhaust line 61a by a shift valve 611 serving as a shifting unit. Further, exhaust lines 62, 63, and 64 have exhaust fans 621, 631, and 641 installed therein, respectively, which, therefore, serve as a power resource for exhausting from an inside of external chamber 21a.

In the exhaust system shown in FIG. 5, each constitutional element which the reference number includes added alphabet, $\lceil b_{\rfloor}$, has the identical structure and function to the constitutional element having the corresponding reference number of liquid processing module 2a. Further, organic exhaust line 62, alkaline exhaust line 63, acid exhaust line 64, shift valve 611, and each exhaust fan 621, 631, and 641 having no added alphabets of $\lceil$a or b$_{\rfloor}$ in the reference numbers correspond to the common usage system of liquid processing modules 2a and 2b in the present embodiment. Such a common usage system is also shifted between liquid processing module 2a and liquid processing module 2b for use and is not used at the same time. For example, the capacity of the exhaust fans 621, 631, and 641 or the diameter of the tube of exhaust lines 62, 63, and 64 are designed to satisfy the maximum load for one of liquid processing modules 2a and 2b.

Returning to the description of entire liquid processing apparatus 1, liquid processing apparatus 1 is connected with a controlling unit 7 as shown in FIGS. 1, 4, and 5. Controlling unit 7 is configured with a computer including, for example, a CPU and a storage unit (not shown). The storage unit stores a program including the programmed step (instructions) groups relating to the control of the operations of liquid processing apparatus 1, i.e., loading wafer W into each liquid processing module 2, performing the liquid processing to wafer W held by wafer holding mechanism 23*a* and 23*b*, drying, and unloading wafer W. Such a program is stored in a storage medium, such as a hard disk, a compact disk, a magnetic optical disk and a memory card, and is installed from the storage medium in the computer.

Liquid processing apparatus 1 according to the present embodiment, the common usage system is used by only one of liquid processing modules 2*a* and 2*b* and is controlled not to be used in both liquid processing modules 2*a* and 2*b* at the same time in order to prevent the load concentration to the common usage system within each share group 20 described in the background. For implementing the control, controlling unit 7 shown in FIGS. 1, 4, and 5 does not wait for the completion of the processing in one liquid processing module 2*a* or 2*b* and loads wafer W into the other processing module 2*b* or 2*a* sharing the common usage system with one of the above liquid processing module 2*a* or 2*b*. A second carrying apparatus 141 or each shift valve 300, 312, 511, and 611 is operated to start the processing in the other liquid processing module 2*b* or 2*a* after completing the processing in one liquid processing module 2*a* or 2*b*. Shift valves 300, 312, 511, and 611 can connect the common usage system of various supply units 31, 32, 33, and 34, drain lines 53, 54, and 55, or exhaust lines 62, 63, and 64 to any one of liquid processing modules 2*a* and 2*b*, or shift them to be in a state where they are separated from any one of liquid processing modules 2*a* and 2*b*.

Figure 6:
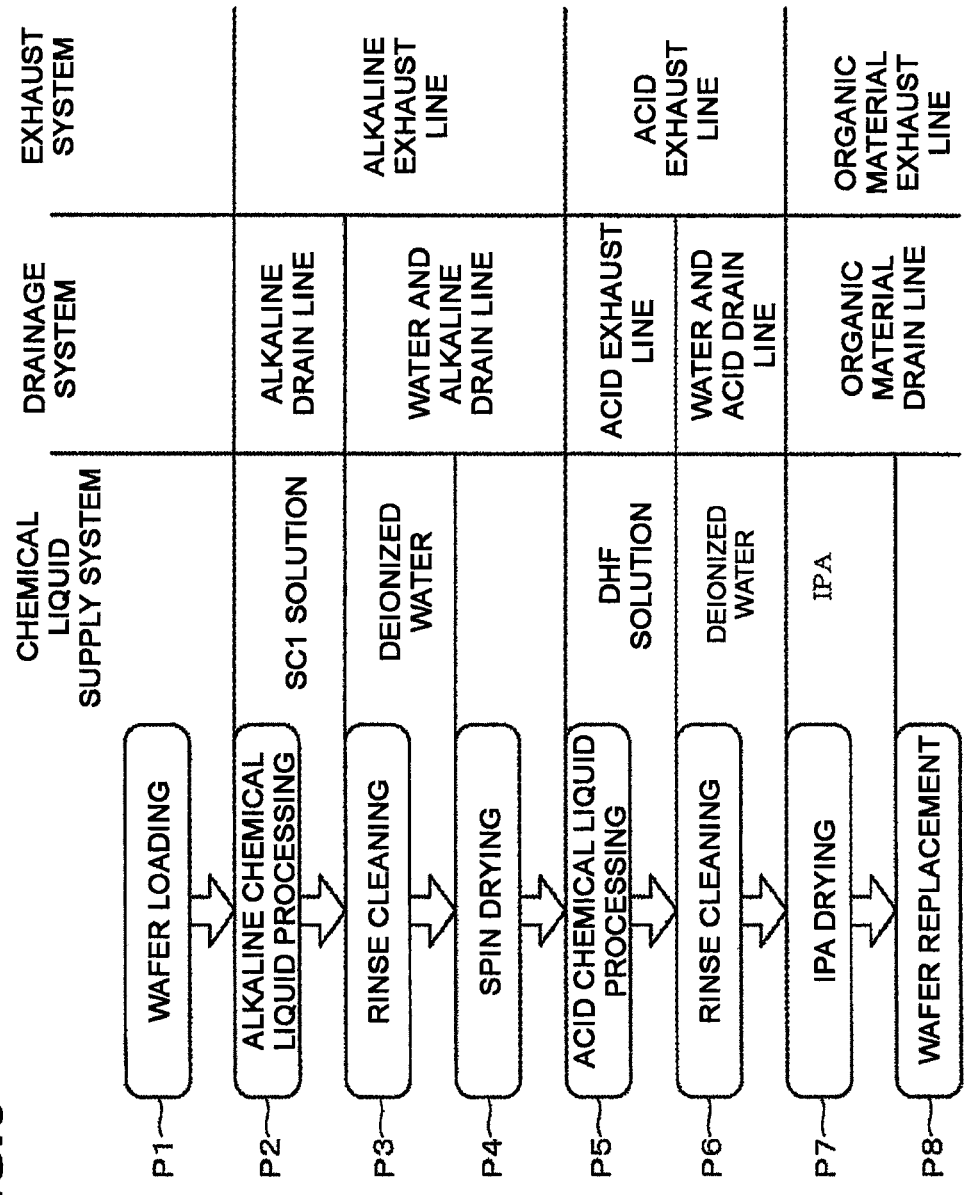
FIG. 6 is a diagram illustrating a connection destination of the common usage system according to the processing executed in each liquid processing module.

Here, controlling unit 7 shifts the chemical liquid supply system, drainage system, or exhaust system in a shifting destination shown in FIG. 6 depending on the type of the processing performed in each liquid processing module 2*a* and 2*b*. In each liquid processing module 2 (2*a* and 2*b*), each operation of wafer loading P1→alkaline chemical liquid processing P2→rinse cleaning P3→spin drying P4→acid chemical liquid processing P5→rinse cleaning P6→IPA drying P7→wafer replacement P8 is repeatedly performed (hereinafter, processing from P2 to P8 is one cycle and wafer loading P1 is performed only in the first cycle), and the chemical liquid supply system, drainage system, and exhaust system are shifted in accordance with the operations.

That is, in the chemical liquid supply system, each common usage system is shifted to supply the SC1 solution for alkaline chemical liquid processing P2, the deionized water for rinse cleaning P3 and P6, and the DHF solution for acid chemical liquid processing P5 to both upper and lower sides of wafer W, and the IPA to the upper surface of wafer for IPA drying P7.

Further, in the drainage system, each common usage system is shifted to alkaline drain line 54 for alkaline chemical liquid processing P2, acid drain line 55 for acid chemical liquid processing P5, and organic drain line 53 for IPA drying P7 and then wafer replacing P8. Further, for rinsing processing P3 and P6 and conventional spin-drying P4, internal cup 22*a* is receded down to a recession position so that the liquid is drained through water drainage lines 56*a* and 56*b*. In the meantime, the connection destination of drain lines 51*a* and 51*b* at this time is maintained to the drain lines 54 and 55 shifted in a previous process.

Further, in the exhaust system, each common usage system is shifted to alkaline exhaust line 63 during the period from alkaline chemical liquid processing P2 to spin-drying P4, to acid exhaust line 64 during the period from acid chemical liquid processing P5 to rinse cleaning P6, and to organic exhaust line 62 during the period of IPA drying P7 to wafer replacing P8. Shift timing of the common usage system, for example, is stored in advance in the storage unit of controlling unit 7 as a processing recipe for the chemical liquid processing in liquid processing apparatus 1.

The operation of liquid processing apparatus 1 having constitutional elements described the above according to the present embodiment will be described. When liquid processing apparatus 1 starts the liquid processing, first carrying mechanism 121 takes out wafer W laid on carrier arrangement unit 11 from carrier C and sequentially lays wafer W on transferring shelf 131 within transferring unit 13. Second carrying mechanism 141, for example, according to the processing schedule shown in FIG. 7, first enters into ⌈module 1 of group 1⌋, e.g., liquid processing module 2*a* shown in FIGS. 4 and 5, and transfers wafer W to wafer holding mechanism 23*a* (P1). During the time for taking out wafer W from transferring shelf 131 and completing the load of wafer W into liquid processing module 2*a* by second carrying mechanism 141, no standby time is incurred in each liquid processing of a subsequent part.

When second carrying mechanism 141 completes to load wafer W into liquid processing module 2*a*, nozzle arm 24*a* moves up to the upper position of a center of wafer W and internal cup 22*a* is ascended up to the processing position. The SC1 solution is supplied from SC1 supply unit 33 to the upper and lower sides of wafer W while rotating wafer W at a rotation speed of, e.g., 10 rpm to 30 rpm by wafer holding mechanism 23*a*. Such that, the liquid film of the chemical liquid is formed on the upper and lower surface of wafer W and the alkaline chemical liquid cleaning P2 is performed. At this time, as shown in FIG. 6, the drainage system of liquid processing module 2*a* is connected to alkaline drain line 54 and the exhaust system is connected to alkaline exhaust line 63 so that the SC1 solution received in internal cup 22*a* is discharged through alkaline drain line 54 and air stream including mist of the SC1 solution is exhausted through alkaline exhaust line 63. It takes, for example, 60 seconds for the alkaline chemical liquid cleaning.

Together with an operation of module 1, second carrying mechanism 141 sequentially loads wafer W to another liquid processing module 2 according to a predetermined order. At this time, second carrying mechanism 141 loads wafer W to one liquid processing module 2*a* in each share group 20 in an order of ⌈module 3 of group 2→module 5 of group 3→module 7 of group 4→ . . . ⌋. Then, in an order of completing the load of wafer W in each liquid processing module 2*a*, the alkaline chemical liquid cleaning is performed in parallel in liquid processing module 2*a*. When observing each share group 20, the alkaline chemical liquid cleaning is performed in only one liquid processing module 2*a* in share group 20.

If the alkaline chemical liquid cleaning is completed in ⌈module 1 of group 1⌋, internal cup 22*a* moves in the recession position, the supply system of the chemical liquid for nozzle arm 24*a* and chemical liquid supply path 231*a* of wafer holding mechanism 23*a* is shifted to deionized water supply unit 34 to supply the deionized water to the upper and lower surfaces of wafer W so that the rinse cleaning for removing the SC1 solution of the surface of wafer W is performed P3. Next, after stopping the supply of the deionized water to wafer W, the rotation speed of wafer W increases by, e.g., 2000 rpm, and the spin-drying of wafer W P4 is performed.

Figure 7:
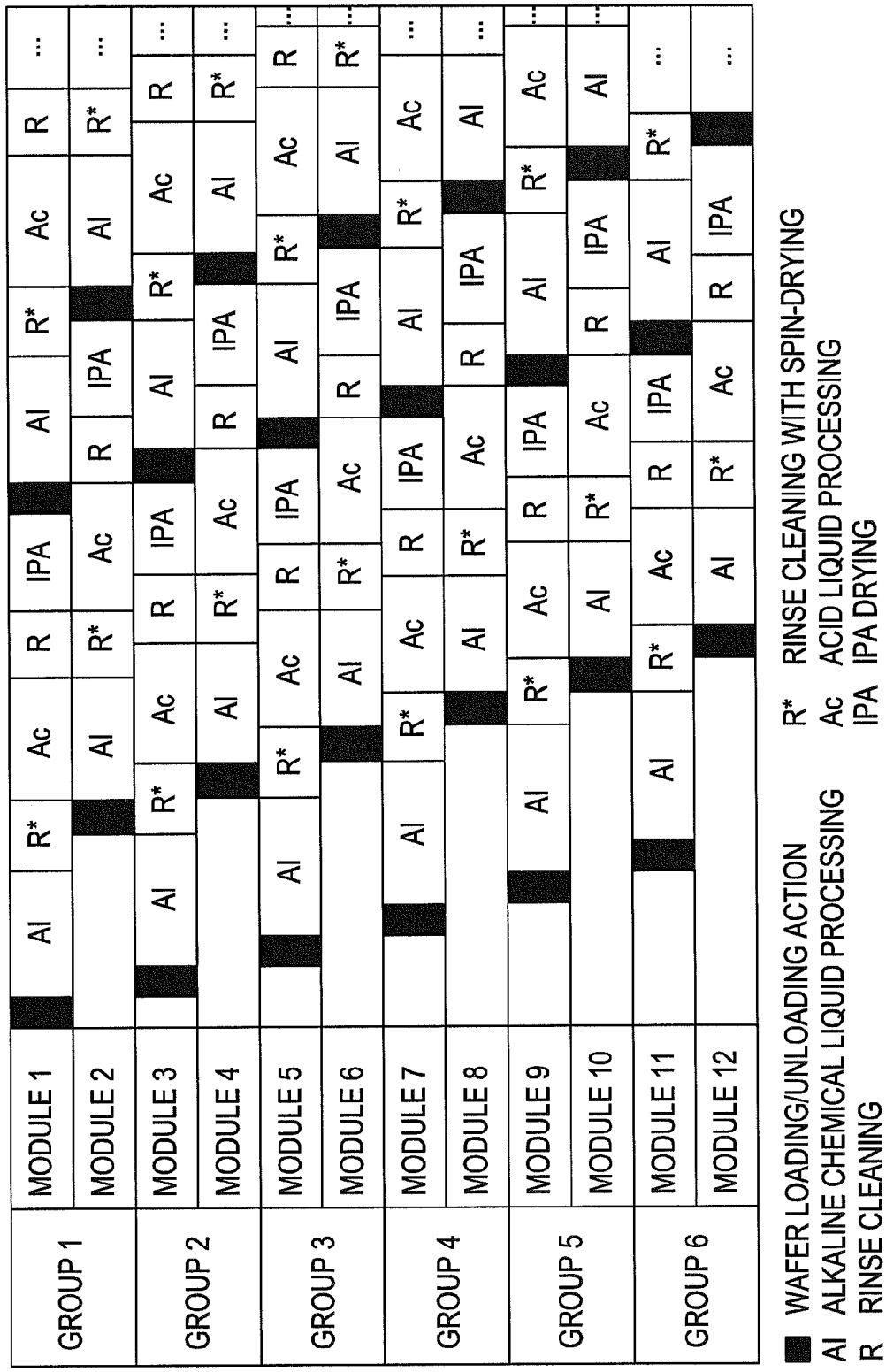
FIG. 7 is a diagram illustrating an example of a processing schedule of a liquid processing executed in each liquid processing module of the liquid processing apparatus.

During the above processing, the drainage system of liquid processing module 2*a* is connected to alkaline drain line 54 so that the deionized water overflowed and fallen from internal cup 22*a* after the rinsing processing is discharged through alkaline drain line 54 and the deionized water received in external chamber 21*a* after the rinsing processing is discharged through water drainage line 56a. Further, the exhaust system is connected to alkaline exhaust line 63 such that the air stream including mist of the deionized water after the rinsing is discharged through alkaline exhaust line 63. It takes about 30 seconds for the rinse cleaning and spin-drying in total. Further, with respect to ⌈module 3 of group 2→module 5 of group 3→module 7 of group 4→ . . . ⌋, the rinse cleaning and spin-drying are sequentially performed as shown in FIG. 7. At this time, a supply system of nitrogen gas may be installed in nozzle arm 24a and chemical liquid supply path 231a of wafer holding mechanism 23a and this may allow to facilitate the drying of wafer W by spraying the nitrogen gas to the surface of wafer W in performing the spin-drying.

Through the above processing, the rinse cleaning and spin-drying are performed in ⌈module 1 of group1⌋ and at the timing right before completing the spin-drying, second carrying mechanism 141 loads wafer W to ⌈module 2 of group 1⌋, e.g., liquid processing module 2b as shown in FIG. 7. At the timing of completing the spin-drying in ⌈module 1⌋ and starting the acid chemical liquid processing, the connection destination of SC1 supply unit 33, alkaline drain line 54, and alkaline exhaust line 63 is shifted toward liquid processing module 2b so that the alkaline chemical liquid cleaning begins in ⌈module 2⌋.

Further, with respect to another share group 20, wafer W is loaded in ⌈module 4 of group 2→module 6 of group 3→module 8 of group 4→ . . . ⌋, and at the timing of completing the spin-drying in one liquid processing module 2a in each share group 20, the connection destination of SC1 supply unit 33, alkaline drain line 54, and alkaline exhaust line 63 is shifted toward liquid processing module 2b so that the alkaline chemical liquid cleaning begins in each liquid processing module 2b. Such that, since the alkaline chemical liquid cleaning is started in the other liquid processing module 2b after the alkaline chemical liquid cleaning is completed in one liquid processing module 2a in each share group, SC1 supply unit 33, alkaline drain line 54, and alkaline exhaust line 63 which are a common usage system can operates without concentrating the load.

Returning to the description of the operation of ⌈module 1 of group 1⌋, after the spin-drying is completed, internal cup 22 is ascended again up to the processing position and the supply system of the chemical liquid for nozzle arm 24a and chemical liquid supply path 231a of wafer holding mechanism 23a is shifted to DHF supply unit 32. Then, the DHF solution is supplied to the upper and lower surfaces of wafer W while rotating wafer W at the rotation speed of, e.g., 10 rpm to 30 rpm. As a result, the liquid film of the DHF solution is formed on the upper and lower surfaces of wafer W and the acid chemical liquid cleaning is performed P5. Then, after a predetermined time, internal cup 22a is descended to the recession position and the supply system of the chemical liquid is shifted to deionized water supply unit 34 and the rinse cleaning P6 is performed. It takes about 60 seconds for the acid cleaning and about 30 seconds for the rinse cleaning.

At this time, as shown in FIG. 6, the drainage system of liquid processing module 2a is connected to acid drain line 55 and the exhaust system is connected to acid exhaust line 64 so that the DHF solution received in internal cup 22a is discharged through acid drain line 55 during the acid chemical liquid cleaning, but on the other hand the air stream including mist of the DHF solution is discharged through acid exhaust line 64. Further, in the rinse cleaning, the deionized water overflowed and fallen from internal cup 22a after the rinsing is discharged through acid drain line 55, the deionized water received in external chamber 21a after the rinsing is discharged through water drainage line 56a, and the air stream including mist of the deionized water after the rinsing is discharged through exhaust line 63.

Then, as shown in FIG. 7, such an acid chemical liquid cleaning is also performed in an order of ⌈module 3 of group 2→module 5 of group 3→module 7 of group 4→ . . . ⌋ and together with the acid chemical liquid cleaning, the alkaline chemical liquid cleaning, rinse cleaning and spin-drying are performed in an order of ⌈module 2 of group 1→module 4 of group 2→module 6 of group 3→ . . . ⌋ in another side.

Then, at the timing of completing the acid chemical liquid processing and rinse cleaning in ⌈module 1 of group 1⌋ and shifting to the IPA drying, the rinse cleaning and spin-drying after the alkaline chemical liquid processing are completed and the acid chemical liquid cleaning is started in liquid processing module 2b which is ⌈module 2 of group 1⌋. Because of this, the connection destination of acid drain line 55 and acid exhaust line 64 having been connected to liquid processing module 2a right before the timing is shifted toward liquid processing module 2b at this timing. Also, since IPA supply unit 31, organic drain line 53, and organic exhaust line 62 are newly connected to liquid processing module 2a to start the IPA drying, the load of the common usage system is decentralized in this case as well.

Further, with respect to another share group 20, at the timing of shifting from the rinse cleaning to the IPA drying in an order of ⌈module 3 of group 2→module 5 of group 3→module 7 of group 4→ . . . ⌋, the acid chemical liquid cleaning is started in an order of ⌈module 4 of group 2→module 6 of group 3→module 8 of group 4→ . . . ⌋ so that the load of the common usage system is decentralized.

Further, internal cup 22a is ascended up to the processing position in ⌈module 1 of group 1⌋ and the IPA drying is performed using the volatility of the IPA by rotating wafer W at the rotation speed of, e.g., 2000 rpm while supplying the IPA to the upper surface of wafer W so that the deionized water remaining on the surface of wafer W after the rinsing is completely removed (P7). Then, internal cup 22a is receded to the recession position, wafer W after the processing is unloaded by second carrying mechanism 141, and new wafer W is loaded into liquid processing module 2b (P8).

The drainage system of liquid processing module 2a is connected to organic drain line 53 during the above processing so that the IPA overflowed and fallen into internal cup 22a is discharged through organic drain line 53, and the exhaust system is connected to organic exhaust line 62 so that the air stream including the IPA is discharged through organic exhaust line 62. It takes about 45 seconds for the IPA drying and about several seconds for replacing wafer W so that these processing can be completed within the short time enough in comparison with each liquid processing.

Also, in ⌈module 3 of group 2→module 5 of group 3→module 7 of group 4→ . . . ⌋, after the IPA drying and the replacement of the wafer are performed, the alkaline chemical liquid processing of the next cycle is started in one liquid processing module 2a in each share group 20 P1.

In the meantime, in the other liquid processing module 2b of each share group 20, the acid chemical liquid processing P5 and rinse cleaning P6 are performed in an order of ⌈module 2 of group 1→module 4 of group 2→module 6 of group 3→ . . . ⌋ and then the IPA cleaning is performed. At this time, the alkaline chemical liquid cleaning of the next cycle is performed in one liquid processing module 2a so that the common usage system of liquid processing modules 2a and 2b is connected to other connection destination so that the load is not concentrated to the common usage system in this case as well.

Then, in the other liquid processing module 2b in each share group 20, at the timing where the IPA drying is completed and wafer W is replaced and the alkaline chemical liquid processing of the next cycle is started, the rinse cleaning and spin-drying after the alkaline chemical liquid cleaning of the preceding next cycle are completed and the acid chemical liquid cleaning is started in one liquid processing module 2a. As described above, with respect to a series of liquid processing cycle related to liquid processing modules 2a and 2b of each share group 20, liquid processing apparatus 1 according to the present embodiment performs the liquid processing allowing each common usage system to operates with at most load for one common usage system without concentrating the load to the common usage system.

Wafer W taken out from each liquid processing module 2 after the liquid processing is carried to transferring shelf 131 by second carrying mechanism 141 and then is taken out by first carrying mechanism 121 to be stored in carrier C of carrier arrangement unit 11. Through continuously performing these operations, liquid processing apparatus 1 can clean a plurality of wafers W while concurrently performing the liquid processing in each liquid processing module 2.

Liquid processing apparatus 1 according to the present embodiment has the following effects. In liquid processing apparatus 1, the usage system (each of chemical liquid supply units 31 to 34, drain lines 53 to 55, exhaust lines 62 to 64, exhaust fans 621, 631, and 641, or the like) used for the supply of the chemical liquid, drainage, and exhaustion of the inside of the processing module is shared in the plurality of liquid processing modules 2a and 2b. Since the timing for performing the processing in each liquid processing modules 2a and 2b is controlled in order not to concurrently perform the identical processing in two liquid processing modules 2a and 2b sharing the common usage system, it can be restrained to use the maximum capacity required in the common usage system. As a result, the cost for equipment can be reduced, and it is possible to contribute to the saving of energy. Also, the load for designing required to the factory from liquid processing apparatus 1 can be reduced.

Figure 8:
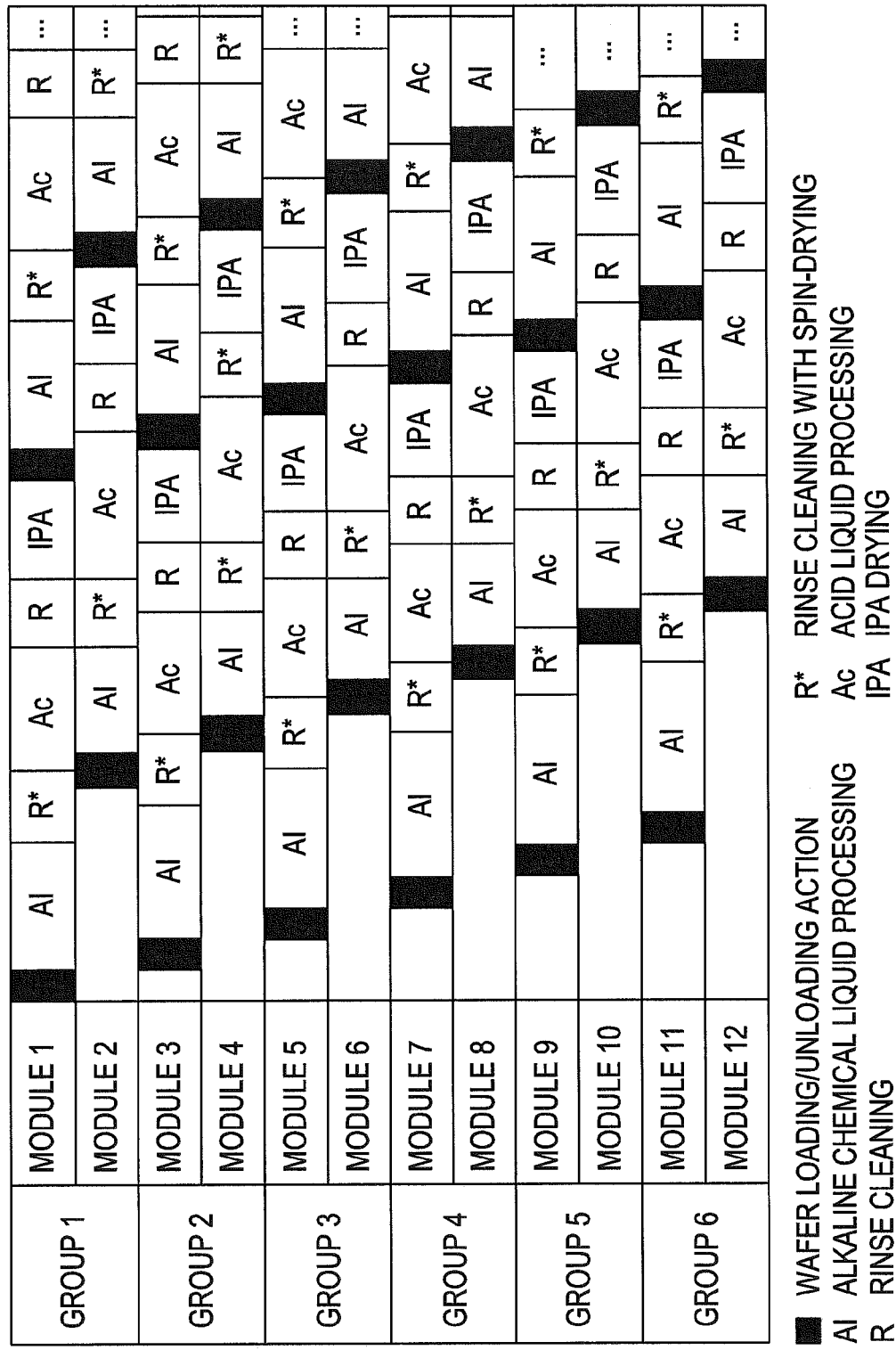
FIG. 8 is a diagram illustrating another example of a processing schedule.

FIG. 7 illustrates an example of the processing schedule where the time taken for the alkaline chemical liquid processing and then the rinse cleaning and spin-drying (e.g., total 90 seconds) is identical to that for the acid chemical liquid processing and then the rinse cleaning (e.g., total 90 seconds). Contrary to this, FIG. 8 illustrates an example of the processing schedule where the time taken for the acid chemical liquid processing is longer by 10 seconds than that for the alkaline chemical liquid processing. This is an example of the processing schedule in which the time taken for the aforementioned processing is not identical.

For example, when observing module 1 and module 2 of group 1, as in the aforementioned processing schedule shown in FIG. 7, if the processing schedule is designed to concurrently start the alkaline chemical liquid processing in module 2 at the timing of starting the acid chemical liquid processing in module 1, the rinse cleaning after the acid chemical liquid processing is not completed in module 1 at the timing of completing the spin-drying after the alkaline chemical liquid processing in module 2. Because of this, if the acid chemical liquid cleaning is started in module 2, the common usage system of acid drain line 55 or acid exhaust line 64, and exhaust fan 641 is burdened with loads for two modules of module 1 and module 2 at the same time.

Accordingly, in the processing schedule shown in FIG. 8, through postponing the timing for loading wafer W to module 2, the load concentration to the common usage system is prevented by according the timing for completing the rinse cleaning after the acid chemical liquid processing in module 1 with the timing for completing the spin-drying after the alkaline chemical liquid processing of module 2.

Figure 9:
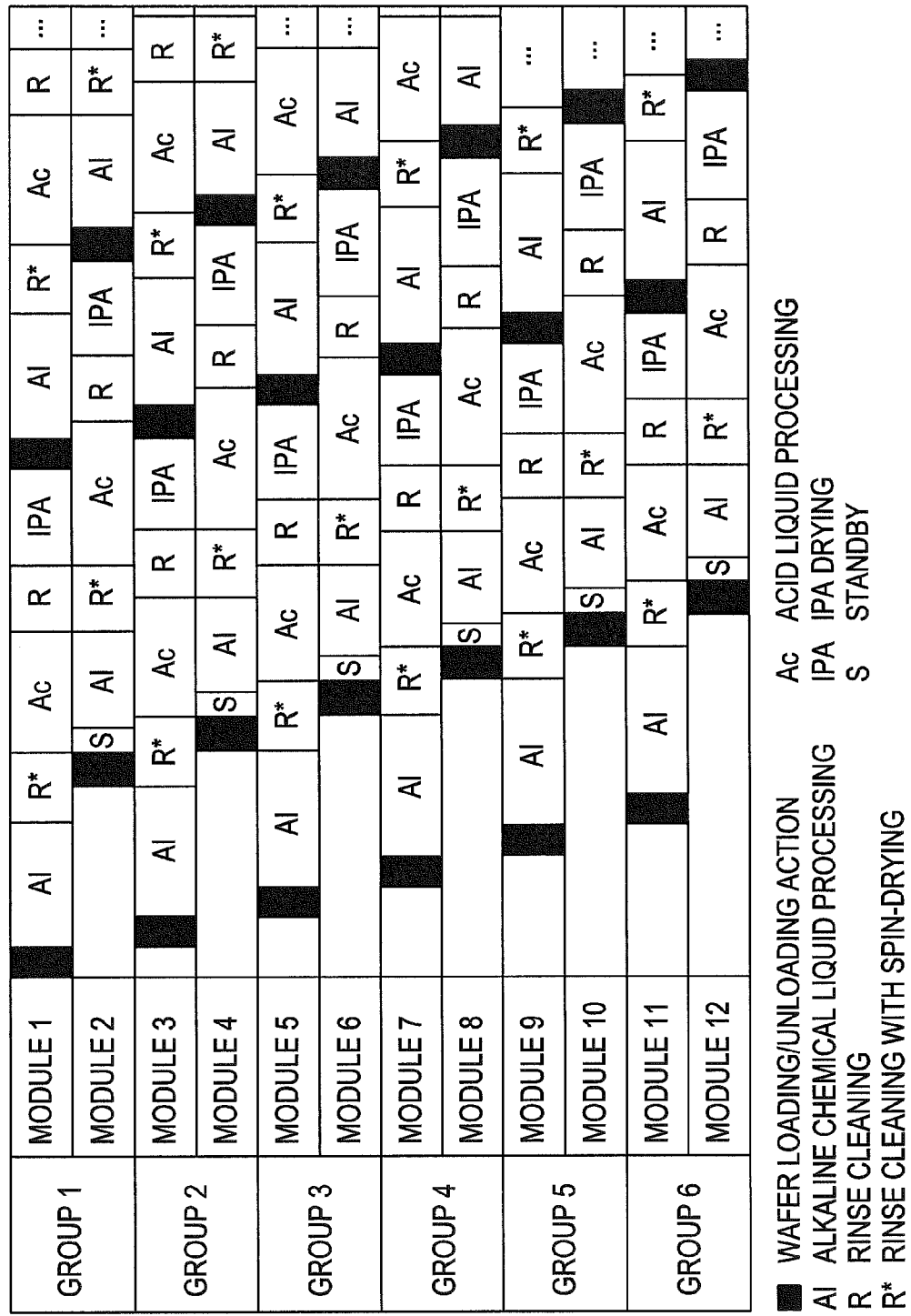
FIG. 9 is a diagram illustrating still another example of a processing schedule.

Further, in this case, instead of controlling the timing for loading wafer W, as shown in FIG. 9, the rinse cleaning after the acid chemical liquid processing in module 1 can be prevented from being overlapped with the acid chemical liquid processing in module 2 by allowing a standby time after completing loading wafer W to module 2. As described above, through changing the timing for loading wafer W or having an appropriate standby time, the load concentration to the common usage system can be prevented even though the carrying schedule is variously changed.

Figure 10:
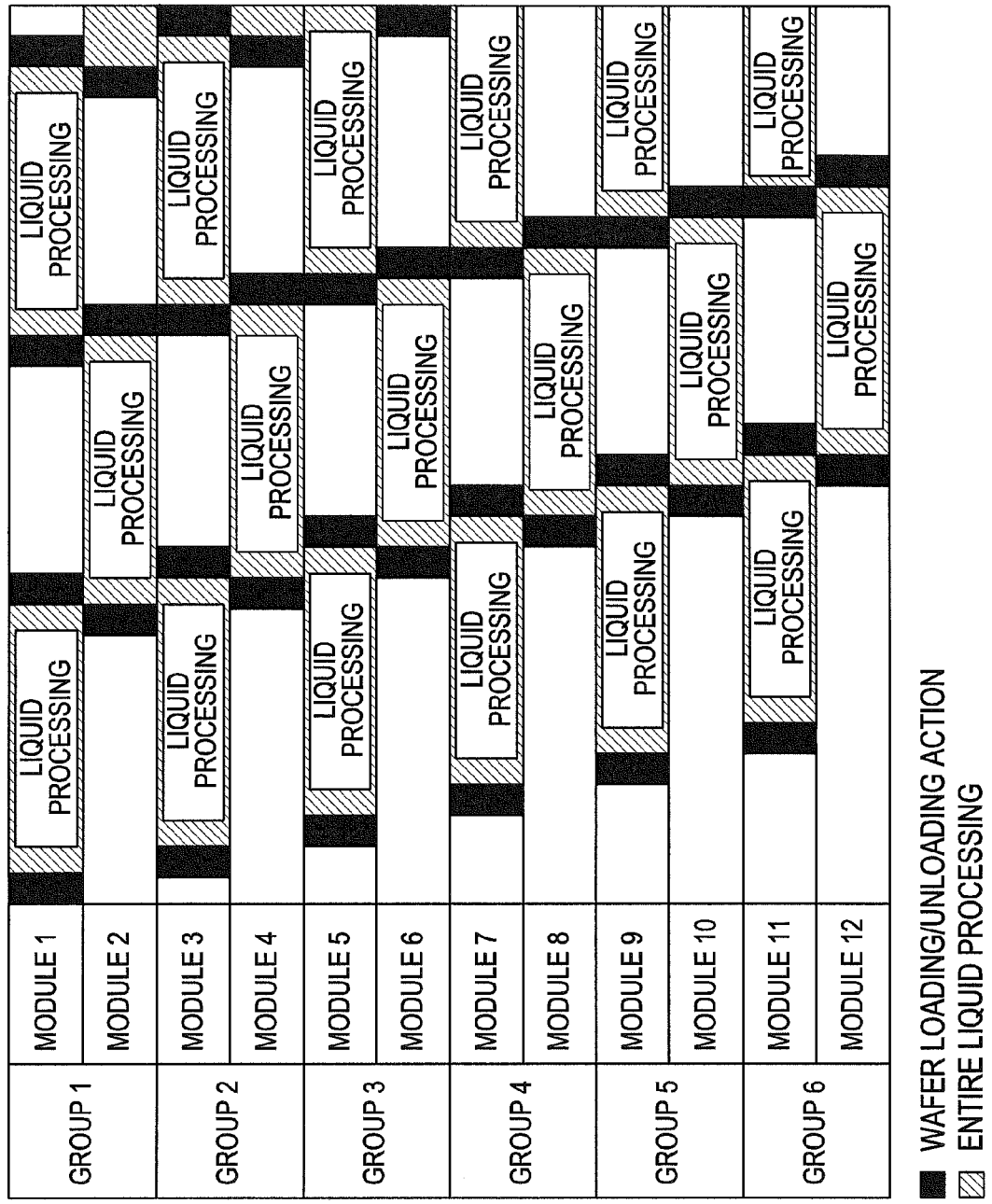
FIG. 10 is a diagram illustrating a modified example of a processing schedule.

Further, the method for preventing the load concentration to the common usage system within the identical group is not limited to the method of controlling the timing for performing loading/unloading wafer W or the processing such as the alkaline chemical liquid processing or acid chemical liquid processing such that each processing included in a series of liquid processing is not overlapped, as described with reference to FIGS. 8 and 9. For example, assuming that a series of processing from alkaline chemical liquid processing P1 to IPA drying P7 shown in FIG. 6 is entirely considered as one "liquid processing", the timing for loading/unloading wafer W can be controlled such that the timing for performing the entire liquid processing is not overlapped with that in processing modules 2 within the identical group, as shown in FIG. 10. In an example shown in FIG. 10, an area filled with hatches refers to the aforementioned entire liquid processing and a vacant area refers to the standby time. In this example, the timing of overlapping the loading/unloading operation of wafer W in two modules 2 is occurred, but in this case, for example, two sets of second carrying mechanisms 141 can be installed in carrying path 142 of liquid treatment apparatus 1. Further, in the present example, wafer W can be loaded within module 2 in advance and the timing for starting the performing the entire liquid processing can be controlled to avoid the load concentration to the common usage system.

Further, the number of liquid processing modules 2 included in liquid processing apparatus 1 is not limited to 6 sets of share groups 20 each including two liquid processing modules 2 as shown in FIG. 2, but may include k sets of share groups 20 (where k is a natural number equal to or greater than 2) each including n liquid processing modules 2 (where n is a natural number equal to or greater than 2).

Figure 11:
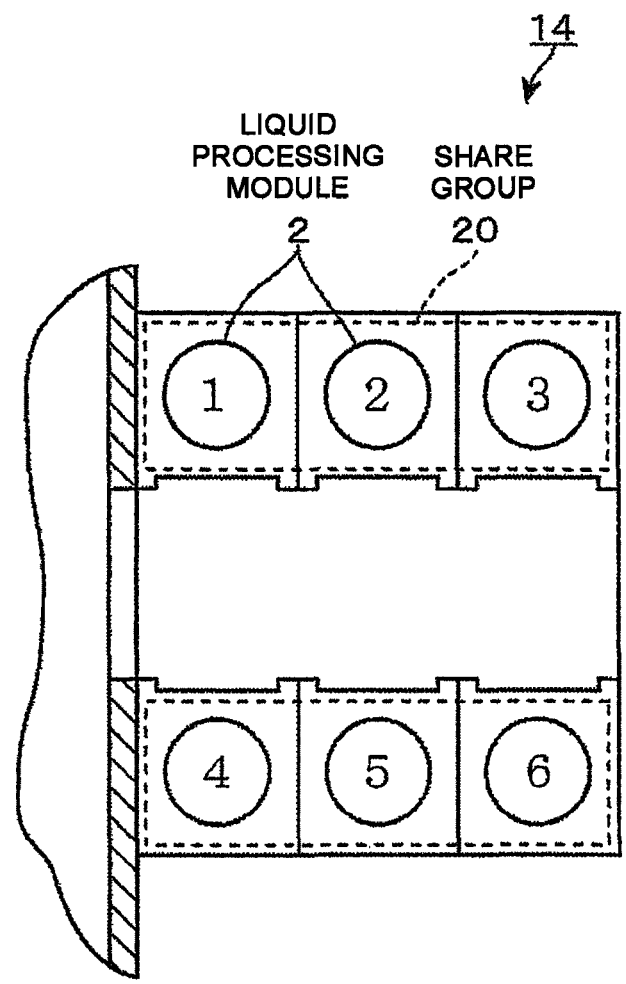
FIG. 11 is a schematic diagram illustrating an arrangement of the liquid processing modules installed on a liquid processing unit according to another embodiment.

For example, liquid processing unit 14 shown in FIG. 11 includes a module group including two sets of share groups 20 each including three (3) liquid processing modules 2. In this case, as shown in FIG. 12, the load of each common usage system can be decentralized to be a load for at most one liquid processing module 2 by controlling the timing for loading wafer W to each module. In FIGS. 11 and 12, the processing performed in liquid processing apparatus 1 is generalized to a case where three (3) kinds of processing, for example, ⌈from a first processing to a third processing⌋ are performed and the common usage system is shifted between three liquid processing modules 2 in three kinds of the processing.

Further, FIG. 13 illustrates an example of the processing schedule where the maximum load of the common usage system is designed to be the load for two liquid processing modules 2 in each share group 20 of liquid processing unit 14 shown in FIG. 11, and in this case, more wafers W for the time unit in comparison with the processing schedule shown in FIG. 12 can be processed. In general, in share group 20 including n liquid processing modules 2, the processing schedule is designed such that the maximum load of the common usage system is designed to be the load for m liquid processing modules 2 (where m is a natural number less than n) so that the load equalization of the common usage system can be achieved. In the example shown in FIG. 12, the timing where the operation of loading/unloading wafer W is overlapped in two liquid processing modules 2 is also occurred, but two sets of second carrying mechanism 141 can be installed as in the case of the example shown in FIG. 10.

Further, although each embodiment described above illustrates an example where alkaline drain line 54 and alkaline exhaust line 63, or acid drain line 55 and acid exhaust line 64 are used as the drainage system and exhaust system, respectively, in the rinse cleaning and spin-drying after the alkaline chemical liquid processing and the rinse cleaning after the acid chemical liquid cleaning, a dedicated drainage system and exhaust system for each rinse cleaning and spin-drying can be used. In this case, as shown in the processing schedule of FIG. 7, the alkaline chemical liquid cleaning can be started in module 2 at the timing of completing the alkaline chemical liquid processing, for example, without waiting for the completion of the spin-drying after the alkaline chemical liquid processing in module 1.

In addition, although exhaust fans 621, 631, and 641 are installed only in exhaust lines 62, 63, and 64 in the aforementioned embodiment, a pump for discharging the liquid drained from drain lines 53, 54, and 55 can be installed in a downstream of each drain line 53, 54, and 55 shown in FIG. 4. According to the present embodiment, required capacity or load for the pump can be reduced.

Further, for example, instead of installing exhaust fans 621, 631, and 641 in each exhaust line 62, 63, and 64, exhaust lines 62, 63, and 64 can be connected to a common exhaust line of a factory to perform an exhaustion. In this case, even if the allowable capacity of the common exhaust line is limited, according to the present disclosure, the maximum load of exhaustion discharged through each exhaust line 62, 63, and 64 is restrained and the exhaustion can be restrained to the allowable exhaust volume for the common drainage line. This is identically applied to the case where the allowable capacity of the common drain line is limited for performing the drainage through a common drainage line of the factory from each drain line 53, 54, and 55.

Further, at this time, the common usage system of the exhaust system of the present disclosure can be employed to case (1) where the exhaust capability is secured for entire liquid processing modules 2 included in each set of share group 20 and the drainage volume of the common usage system of the drainage system is limited, and on the contrary, case (2) where the drainage capability is secured for entire liquid processing modules 2 included in each set of share group 20 and the exhaust volume of the common usage system of the exhaust system is limited.

Further, the processing module according to the present disclosure is not limited to said liquid processing module 2, and can be applied to various processing apparatuses, such as a coating apparatus for applying a processing liquid to a surface of a substrate to form a coating film, a vacuum drying processing apparatus for drying a solvent included in a coated coating film under a vacuum atmosphere, or a scrubber apparatus for scrubber cleaning with deionized water prior to performing an immersion lithography of a wafer. In the scrubber apparatus, the deionized water corresponds to a processing liquid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing apparatus, comprising:
a processing module group in which a plurality of processing modules of the processing apparatus are divided into k sets of share groups each comprising n processing modules to perform a substantially identical processing for each substrate (where each of k and n is a natural number equal to or greater than 2);
a common usage system independently provided for each set of the share groups and shared by n processing modules of each set of the share groups, and having a maximum capacity capable of processing m processing modules (where in is a natural number less than n), the capacity of the common usage system being substantially identical in each set of the share groups;
a carrying device to transfer a plurality of substrates to the processing modules of each set of the share groups; and
a controlling unit configured to control the carrying device to repeatedly perform a loading action that sequentially loads the plurality of substrates from a first set to a $k^{th}$ set of the share groups, and
wherein when the common usage system is used for m processing modules of each set of the share groups, the controlling unit has two modes of operation, either of which may be selected by a user, such that:
in one mode, the controlling unit controls the carrying device to begin loading substrate to one processing module in a set so that the completion of substrate loading coincides with the completion of a process in another processing module in the set; and
in another mode, the controlling unit controls the carrying device to begin loading a substrate to one processing module in the set so that the completion of substrate loading will occur a predetermined period of time following the completion of a process in another processing module.

2. The processing apparatus as claimed in claim 1, wherein the common usage system comprises a shifting unit to shift a usage of the common usage system from one processing module to another processing module at the time when the carrying device loads the substrate to another processing module in the set or when the processing module starts the processing in said another processing module after the completion of the processing in said one processing module.

3. The processing apparatus as claimed in claim 1, wherein the processing performed in one of the processing modules comprises a process to supply a processing liquid to the substrate, and
the common usage system is an exhaust system to exhaust an atmosphere of the processing liquid in the processing module.

4. The processing apparatus as claimed in claim 1, wherein the processing performed in one of the processing modules is a chemical liquid processing continuously performed several times with changing a type of a chemical liquid supplied to the substrate, and
the common usage system is an exhaust system provided for each type of chemical liquid and configured to exhaust an atmosphere of the chemical liquid during the chemical liquid processing.

5. The processing apparatus as claimed in claim 4, wherein the chemical liquid processing is a process to clean the substrate.

6. The processing apparatus as claimed in claim 1, wherein the processing performed in one of the processing modules comprises a process to supply the processing liquid to the substrate, and the common usage system is a processing liquid supply system to supply the processing liquid.

7. The processing apparatus as claimed in claim 1, wherein the processing performed in one of the processing modules comprises a process to supply the processing liquid to the substrate, and the common usage system is a drainage system to discharge a liquid scattered or overflowed from the substrate.

8. A method for operating a processing apparatus, the processing apparatus comprising a processing module group in which a plurality of processing modules of the processing apparatus are divided into k sets of share groups each comprising n processing modules to perform a substantially identical processing for each substrate (where each of k and n is a natural number equal to or greater than 2), and a common usage system independently provided for each set of the share groups and shared by n processing modules of each set of the share groups, and having a maximum capacity capable of processing m processing modules (where m is a natural number less than n), the capacity of the common usage system being substantially identical in each set of the share groups, the method comprising:

dividing processing modules in the processing apparatus into k sets of share groups each including n processing modules;

repeatedly loading substrates to a first set to a $k^{th}$ set of the share groups in sequence by a carrying device; and when the common usage system is used for m processing modules of each set of the share groups, the user selects either of two modes of operation supported by a controlling unit, such that:

in the first mode, the controlling unit controls the carrying device to begin loading a substrate to one processing module in a set so that the completion of substrate loading coincides with the completion of a process in another processing module in the set and in the second mode, the controlling unit controls the carrying device to begin loading a substrate to one processing module in the set so that the completion of substrate loading will occur a predetermined period of time following the completion of a process in another processing module.

9. The method as claimed in claim 8, further comprising shifting a usage of the common usage system from one processing module to another processing module at the time of loading the substrate in said step (1) or at the time of starting the processing in said step (2).

10. The method as claimed in claim 8, wherein the processing performed in one of the processing modules comprises supplying a processing liquid to the substrate, and the common usage system is an exhaust system to exhaust an atmosphere of the processing liquid in the processing module.

11. The method as claimed in claim 8, wherein the processing performed in one of the processing modules is a chemical liquid processing continuously performed several times with changing a type of a chemical liquid supplied to the substrate, and the common usage system is an exhaust system provided for each type of chemical liquid and configured to exhaust an atmosphere of the chemical liquid during the chemical liquid processing.

12. The method as claimed in claim 11, wherein the chemical liquid processing is a process to clean the substrate.

13. The method as claimed in claim 8, wherein the processing performed in one of the processing modules comprises supplying the processing liquid to the substrate, and the common usage system is a processing liquid supply system to supply the processing liquid.

14. The method as claimed in claim 8, wherein the processing performed in one of the processing modules comprises supplying the processing liquid to the substrate, and the common usage system is a drainage system to discharge a liquid scattered or overflowed from the substrate.

* * * * *